United States Patent [19]

Jambotkar

[11] Patent Number: 4,981,807
[45] Date of Patent: Jan. 1, 1991

[54] PROCESS FOR FABRICATING COMPLEMENTARY VERTICAL TRANSISTOR MEMORY CELL

[75] Inventor: Chakrapani G. Jambotkar, Hopewell Junction, N.Y.

[73] Assignee: International Business Machines Corporation, Armonk, N.Y.

[21] Appl. No.: 265,062

[22] Filed: Oct. 31, 1988

[51] Int. Cl.$^5$ .................. H01L 21/20; H01L 21/331
[52] U.S. Cl. ........................................ 437/31; 437/55; 437/909; 437/915; 437/52; 148/DIG. 72; 148/DIG. 87; 148/DIG. 11; 148/DIG. 109
[58] Field of Search ................ 437/31, 55, 126, 909, 437/915; 148/DIG. 72, DIG. 87, DIG. 109, DIG. 11; 357/16, 34, 38

[56] References Cited

U.S. PATENT DOCUMENTS

| | | | |
|---|---|---|---|
| 3,939,039 | 5/1976 | Bonis et al. | 148/175 |
| 4,122,482 | 10/1978 | Bonis et al. | 357/46 |
| 4,274,891 | 6/1981 | Silvestri et al. | 148/175 |
| 4,482,906 | 11/1984 | Hovel et al. | 357/16 |
| 4,483,726 | 11/1984 | Isaac et al. | 148/187 |
| 4,485,552 | 12/1984 | Magdo et al. | 29/577 |
| 4,573,064 | 2/1986 | McLevige et al. | 357/16 |
| 4,586,071 | 4/1986 | Tiwari | 357/34 |
| 4,593,305 | 6/1986 | Kurata et al. | 357/34 |
| 4,617,724 | 10/1986 | Yokoyama et al. | 437/31 |
| 4,625,223 | 11/1986 | Komatsubara et al. | 357/17 |
| 4,635,087 | 1/1987 | Birrittella et al. | 357/38 |
| 4,649,411 | 3/1987 | Birrittella | 357/36 |
| 4,771,013 | 9/1988 | Curran | 148/DIG. 11 |
| 4,807,008 | 2/1989 | Chang et al. | 357/16 |

FOREIGN PATENT DOCUMENTS

| | | | |
|---|---|---|---|
| 0049658 | 3/1987 | Japan . | |
| 0188969 | 8/1988 | Japan | 437/31 |
| 0239983 | 10/1988 | Japan | 437/31 |

OTHER PUBLICATIONS

A 1024-Byte ECL Random Access Memory Using a Complementary Transistor Switch (CTS) by J. A. Dorler et al., pp. 126-134, IBM's Research Develop, vol. 25; No. 3.

Primary Examiner—Brian E. Hearn
Assistant Examiner—Tuan Nguyen
Attorney, Agent, or Firm—Donald M. Boles; Yen S. Yee

[57] ABSTRACT

A compact complementary transistor switch (CTS) memory cell structure utilizing both vertical PNP and vertical NPN transistors in gallium arsenide technology is described. The base region of the vertical PNP transistor merges with the collector region of the vertical NPN transistor. The collector region of the vertical PNP transistor merges with the base region of the vertical NPN transistor. The emitter of the vertical PNP transistor is at the top, and the emitter of the vertical NPN transistor is at the bottom in relation to the emitter of the vertical PNP transistor. This structure leads to improvements in memory density, performance and wireability of a memory array comprising many such cells. A novel yet simple process for making such compact CTS memory cells is also disclosed.

8 Claims, 2 Drawing Sheets

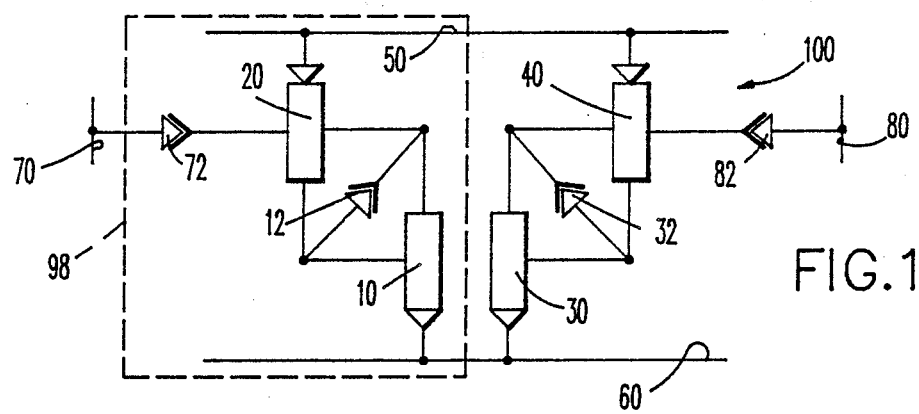
FIG.1
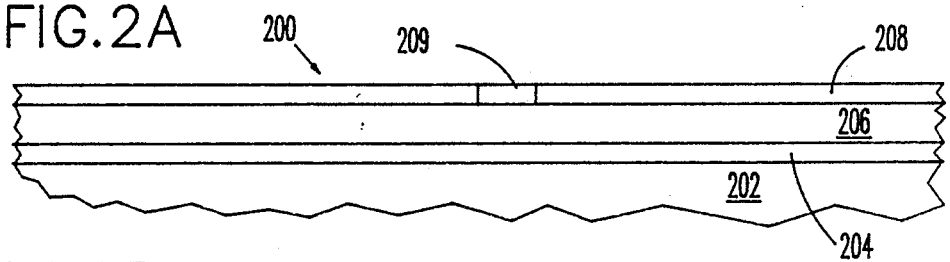
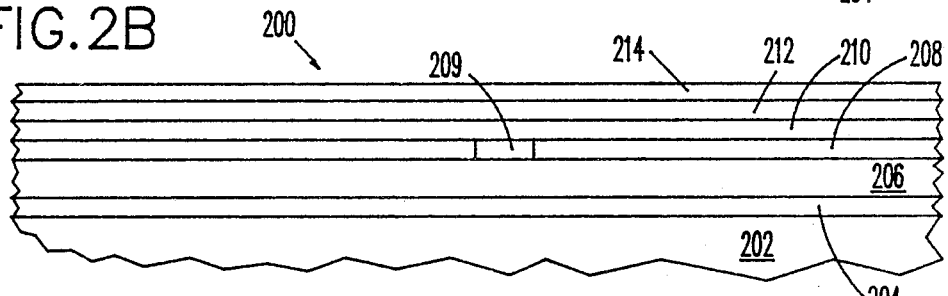
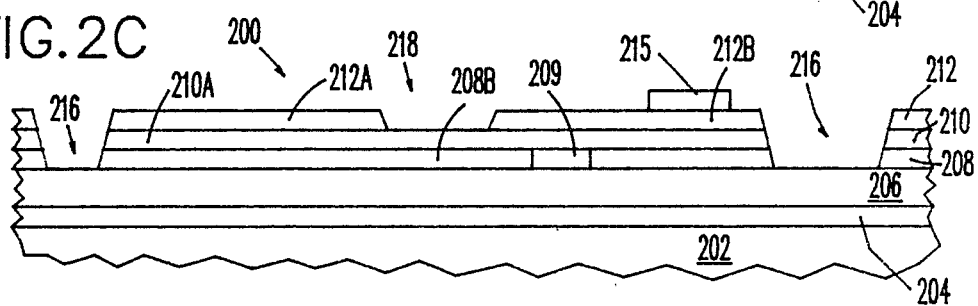
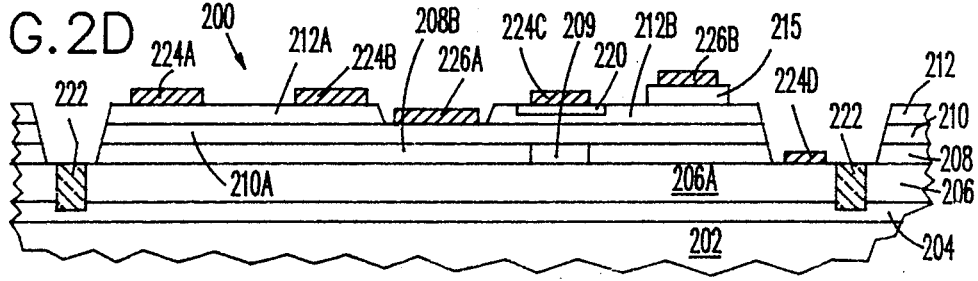

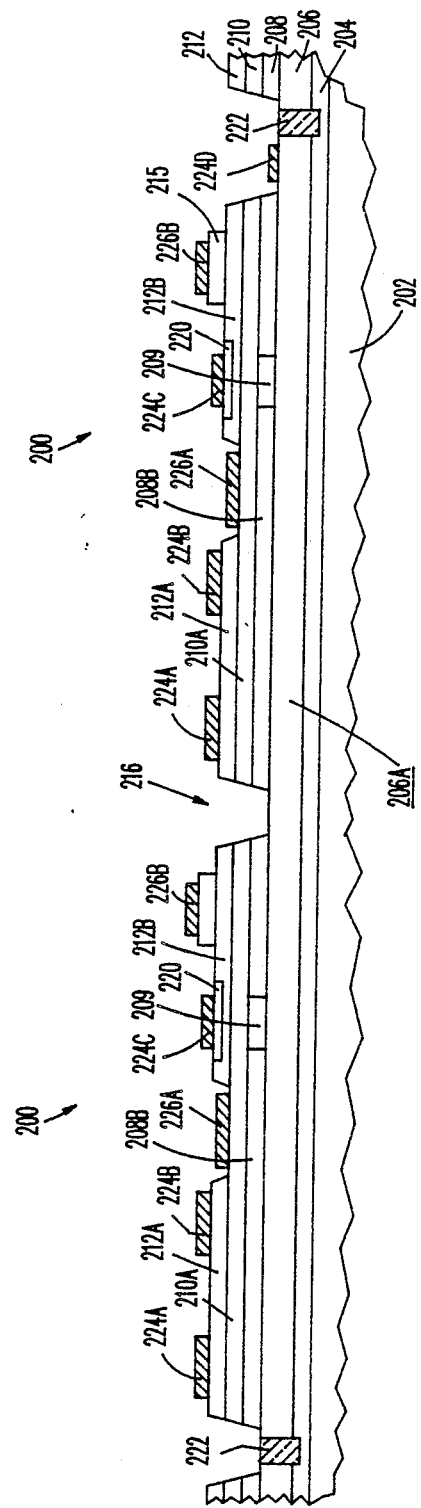

PROCESS FOR FABRICATING COMPLEMENTARY VERTICAL TRANSISTOR MEMORY CELL

TECHNICAL FIELD

This invention relates generally to monolithically integrated bipolar devices and process for making the same, and, more particularly, to a gallium arsenide (GaAs) bipolar static memory device and a process for making the same.

BACKGROUND ART

The advantages of monolithically integrated circuits and the emergence of very large scale integration (VLSI) techniques, have made possible denser and higher speed random access memory (RAM). Moreover, the demand for high performance computers has placed an ever increasing requirement for higher performance RAM. In response to these demands, the electronic data processing industry continues to strive for higher performance static RAM devices and processes for making such static RAM devices, especially in cache memory applications.

Generally, the industry has employed emitter-coupled logic (ECL) circuits to meet high performance requirements. In particular, for high performance memory applications, ECL RAM using a complementary transistor switch (CTS) memory cell has been employed.

For instance, in an article entitled, "A 1024—Byte ECL Random Access Memory Using a Complementary Transistor Switch (CTS) Cell", by J. A. Dorler, et al, pages 126–134 IBM Journal of Research and Development, Vol. 25, No. 3, May, 1981, the performance advantages of CTS cells in achieving high circuit density and good performance in silicon RAM are described.

Heretofore, CTS Memory devices employing a vertical NPN transistor and a relatively large lateral PNP transistor in silicon technology are known. Recently, III-V compounds such as gallium arsenide (GaAs), with higher electron mobility, higher transconductance, and less delay associated with less charge storage, have been considered important for high performance applications.

Many efforts have been directed at fabricating complementary vertical NPN and vertical PNP transistors on a monolithic semiconductor device. U.S. Pat. No. 3,959,039 issued May 25, 1976 to Bonis, et al, entitled "Method of Manufacturing Vertical Complementary Bipolar Transistors each with Epitaxial Base Zones" describes a method for realizing an epitaxial region which can serve as the base of a vertical transistor as well as the collector of a second complementary vertical transistor in a Darlington arrangement. Related U.S. Pat. No. 4,122,482 teaches and claims the resulting Darlington device structure.

U.S. Pat. No. 4,485,552 issued Dec. 4, 1984 to Magdo, et al, entitled "Complementary Transistor Structure and Method for Manufacture" teaches a method for making both complementary vertical NPN and vertical PNP transistors having matched performance characteristics, in which transistors are completely isolated from one another.

DISCLOSURE OF THE INVENTION

It is a principal object of the present invention to provide a vertical bipolar complementary transistor structure for CTS memory cells.

It is also a primary object of the present invention to provide a vertical complementary bipolar transistor structure for CTS memory cell with improved wireability.

It is an object of the present invention to provide an improved semiconductor memory device.

It is another object of the present invention to provide a process for fabricating memory cells formed from vertical, complementary bipolar transistors.

Still another object of the present invention is to provide a method of fabricating compact CTS memory cells.

These and other objects of the present invention are achieved by providing a device structure, wherein the base region of a vertical PNP transistor merges and shares the collector region of a vertical NPN transistor; the collector region of the vertical PNP transistor merges and share the same base region of the vertical NPN transistor; and the emitter of the vertical PNP transistor is at the top, and the emitter of vertical NPN transistor is at the bottom in relation to the position of the emitter of the vertical PNP transistor.

The nature, principle, utility, other objects, features and advantages of this invention will be apparent from the following more particular description of the invention, as illustrated in the accompanying drawings:

BRIEF DESCRIPTION OF THE DRAWINGS

The details of the invention will be described in connection with the accompanying drawings.

FIG. 1 is a schematic diagram showing one complementary transistor switch (CTS) memory cell connected to its Word Line, Drain Line and Bit Lines in a memory array arrangement.

FIGS. 2A–C show cross-sectional views of a semiconductor substrate at various intermediate states in the process of fabricating a half side of the symmetrical CTS cell in accordance with the present invention.

FIG. 2D shows a cross-sectional view of a half side of the symmetrical CTS cell structure in accordance with the present invention.

FIG. 3 shows a cross-sectional view of a CTS cell structure comprising two identical half cell arrangements in accordance with the present invention.

BEST MODE FOR CARRYING OUT THE INVENTION

Referring to FIG. 1, there is shown a single symmetrical CTS memory cell 100 which could be arranged in an array forming a static RAM device. CTS cell 100 comprises cross-coupled bipolar NPN transistors 10 and 30, and complementary PNP bipolar transistors 20 and 40. The emitters of transistors 20 and 40 are connected to the Word Line 50 and the emitters of transistors 10 and 30 are connected to the Drain Line 60. The bases of transistors 20 and 40 are connected to the Left Bit Lines 70, and Right Bit Line 80, by way of Schottky barrier diodes (SBD) 72 and 82, respectively. SBDs 12 and 32 are connected to clamp the base and collector of transistors 10 and 30, respectively.

The symmetrical nature of CTS cell 100 permits the cell 100 to be divided into two half cells 98. Because of the symmetrical nature of the CTS cell 100, a detailed description of its half cell 98 and its fabrication, will allow a simplified explanation of the fabrication of the entire cell 100 in accordance with the present invention. The device structure 200, hereinafter also referred to as a half cell arrangment, in accordance with the invention for half cell 98 is illustrated in FIG. 2D. The vertical NPN transistor 10 of half cell 98 is constituted by N-type region 212B, P-type region 210A and N-type region 209 in undoped region 208B. The vertical PNP transistor 20 is constituted by P-type region 215, N-type region 212B and P-type layer 210A. More particularly, the vertical NPN transistor 10 has its emitter 209 by way of the N+ region 206A at the bottom; and relative to the emitter 209 position of NPN transistor 10, the emitter 215 of the PNP transistor 20 is at the top. This feature of the half cell arrangement 200 improves greatly the wireability of the CTS cell 100 when connected in an array, especially in view of the common Word Line 50, the common Drain Line 60 as well as the orthogonal Left Bit Line 70 and Right Bit Line 80. Moreover, the base region 210A of the vertical NPN transistor 10 is common with the collector region 210A of the vertical PNP transistor 20, and the collector region 212B of the vertical NPN transistor 10 is also in common with the base region 212B of the vertical PNP transistor 20. This vertical arrangement of transistors 10 and 20 and the merged and commonly shared device regions 210A and 212B lead to a very compact, high performance device structure 200 for half cell 98 in the fabrication of CTS cell 100. The process steps leading to the device structure 200 will be described in detail next.

Referring to FIG. 2A, the fabrication of device structure 200 begins with a semi-insulating gallium arsenide substrate 202. An optional, though preferable, gallium arsenide buffer layer 204 could be formed on substrate 202. Next, an N+ doped gallium arsenide layer 206 of about 2000-4000 Å thickness is formed over buffer layer 204. An undoped aluminum gallium arsenide layer 208 of about 1000 Å thickness is then grown over the N+ doped gallium arsenide layer 206. Layers 204, 206 and 208 are preferably formed successively in one metallorganic chemical vapor deposition (MOCVD) or molecular beam epitaxial (MBE) operation. Selected regions 209 in the aluminum gallium arsenide layer 208 could then be doped with N type dopants by utilizing a photoresist mask and by ion implantation.

Referring now to FIG. 2B, a P-type gallium arsenide layer 210 of about 1000 Å thickness, an N-type gallium arsenide layer 212 of about 2000 Å thickness, and a P-type gallium arsenide layer 214 of about 2000 Å thickness are then successively formed using MOCVD or MBE. P-type gallium arsenide layer 214 is then etched away using well known and conventional lithographic and reactive ion etching (RIE) techniques leaving regions of P-type gallium arsenide 215 as illustrated in FIG. 2C. Using conventional lithographic and RIE techniques or possibly wet etching to etch, at peripheral regions 216 surrounding device structure 200, portions of N-type layers 212, P-type layer 210 and undoped layer 208 are removed to expose layer 206. Utilizing conventional lithographic and RIE techniques, portions of N-type layer 212 are etched at region 218 to expose layer 210. Regions 212A and 212B remain contiguous and connected in the third dimension. The resulting structure is illustrated in FIG. 2C.

Next, using a photoresist mask and ion implantation of N-type dopants, for example, silicon ions, N+ regions 220 are formed on the surface of region 212B. This is followed by substrate annealing to activate the implanted dopants. At this stage, photoresist mask and ion implantation of non-conductive dopants, for example, hydrogen ions, could be utilized to form isolation regions 222 surrounding device structure 200 and to isolate region 206A out of layer 206. Also, Schottky barrier diodes (SBD) 12 and 72 could be formed on the N-type layer 212A via contacts 224A, 224B, respectively; and Ohmic contacts 224C, 224D could then be formed on the N+ regions 220 and the N+ region 206A respectively, preferably in a simultaneous fashion. Contacts 224B and 226A are connected via a conductor (not shown). Conventional lift-off techniques may be employed to remove any unwanted metallurgy. Furthermore, Ohmic contacts 226 to the P-type regions 210A and 215 could be made using conventional metallurgy; and lift-off techniques could be employed to remove any unwanted metal. The foregoing processing steps in accordance with the invention lead to the device structure 200 as illustrated in FIG. 2D.

The processing could then be completed in a conventional fashion using a passivation layer; forming via holes in the passivation layer; forming an interconnection metallurgy; and then continuing on with higher level interconnection metallurgy.

While Applicant's preferred embodiment for his invention is shown and described utilizing gallium arsenide, it is clear that other alternatives, for example, other III-V compounds, are also possible. Likewise, although Applicant's preferred embodiment shows a PNP transistor 20 and an NPN transistor 10 in device structure 200, it is understood more generally that transistors 20 and 10 could be switched and yet remain complementary.

Although the cross-sectional view of device structure 200 shows and describes a P-type gallium arsenide layer 214, on the top, it is clear that other alternatives are possible, for example, layer 214 could be aluminum gallium arsenide (AlGas) with a P-doped region 215.

While the formation of Schottky barrier diodes 12, and 72, and Ohmic contacts 224C, 224D to the N+ regions 220 and N+ layer 206, respectively, as well as the ohmic contacts 226A, 226B to P-type regions 210A and 215, respectively, are shown and described subsequent to the formation of isolation regions 222, the sequence of such formations could be altered in an appropriate manner, together with appropriate intervening heat cycles.

Although only a single half-cell 98 is shown and described on device structure 200, it is understood that two such half cells 98 could be processed together and interconnected to form a CTS cell 100. For instance, FIG. 3 shows two half-cells 98 fabricated using two identical half cell arrangements 200, which are being isolated substantially from each other at etched region 216, to implement the CTS cell 100 in accordance with Applicant's invention. More particularly, the emitters of the NPN transistors in both half cell arrangements 200 are connected together by way of region 206A; the emitters of both the PNP transistors in both half cell arrangements 200 could be connected together; and both the NPN transistors are cross-coupled to form a CTS cell 100, which could be isolated from other CTS cell 100 by isolation region 222. More generally, many such CTS cells 100 could be integrated and interconnected in an array forming a static RAM integrated circuit device.

Unlike the conventional CTS memory cell device structures fabricated in the silicon technology, wherein usually the NPN transistor 10 is a vertical device with its emitter at the top, and the PNP transistor 20 is a relatively large lateral device, the present invention teaches a device structure 200 featuring both a vertical NPN transistor 10 and a vertical complementary PNP transistor 20. In accordance with Applicant's invention, the base region 212B of vertical PNP transistor 20 merges and shares the same collector region 212B of vertical transistor NPN 10. Furthermore, the collector region 210A of vertical PNP transistor 20 merges and shares the same base region 210A of vertical NPN transistor 10. These resulting merged features lead to a very compact CTS cell 100 and accordingly also improve its performance. In accordance with another feature of Applicant's invention, the emitter of vertical PNP transistor 20 is at the top, and the emitter of vertical NPN transistor 10 is at the bottom in relation to the position of the emitter of vertical PNP transistor 20. This structural arrangement further improves the compactness and performance of the CTS cell 100. Even more importantly, this arrangement also improves the wireability of a memory array comprising many CTS cell 100, especially in view of the parallel Word Line 50 and Drain Line 60, as well as the pair of parallel Left Bit Line 70 and Right Bit Line 80, both of which are orthogonal to both Word Line 50 and Drain Line 60. While the resulting very compact device structure 200 improves density, performance and wireability, Applicant's invention, in accordance with the above teachings, is achieved by a fairly simple yet novel fabrication process.

From the preceding detailed description of Applicants' invention, it is seen that static RAM devices constructed according to the teaching of the present invention have advantages heretofore not possible to achieve. In addition to the variations and modifications of Applicants' described preferred embodiments, which have been suggested, many other variations and modifications will be apparent to those skilled in this art, and accordingly, the scope of Applicant's invention is not to be construed to be limited to the particular embodiments shown or suggested.

Having thus described applicant's invention, what is claimed as new, and desired to be secured by Letters Patent is:

1. A method of manufacturing a semiconductor device having vertical complementary bipolar transistors comprising the steps of:
    (a) providing a semi-insulating substrate;
    (b) forming a first epitaxial layer of a first type conductivity overlying said substrate;
    (c) forming an semi-insulating layer having a doped region of said first conductivity type overlying said first epitaxial layer;
    (d) forming a second epitaxial layer of a second type of conductivity overlying said semi-insulating layer;
    (e) forming a third epitaxial layer of said first conductivity type overlying said second epitaxial layer;
    (f) forming a fourth epitaxial layer of said second conductivity type overlying said third epitaxial layer;
    (g) forming a first vertical transistor:
        (i) an emitter of said first conductivity being constituted by said doped region of said semi-insulating layer;
        (ii) a base of a region of said second conductivity being constituted by said second epitaxial layer; and
        (iii) a collector of said first conductivity being constituted by a region of said third epitaxial layer; and
    (h) forming a second vertical transistor complementary to said first vertical transistor:
        (i) an emitter being constituted by a region of said fourth epitaxial layer;
        (ii) a base being constituted by said region of said third epitaxial layer and common to said collector of said first vertical transistor;
        (iii) a collector being constituted by said region of said second epitaxial layer and common to said base of said first vertical transistor; wherein said emitter of said first vertical transistor being on the bottom; and said emitter of said second complementary vertical transistor being on the top relative to said emitter of said first vertical transistor.

2. A method of manufacturing a semiconductor device as set forth in claim 1, wherein said doped region in said semi-insulating layer is formed by first forming an undoped layer and then forming said doped region by ion-implanting a dopant of said first conductivity type.

3. A method of manufacture of a semiconductor device as set forth in claim 2, wherein said undoped layer is AlGaAs.

4. A method of manufacture of a semiconductor device as set forth in claim 2, wherein said undoped layer is GaAs.

5. A method of manufacturing a semiconductor device as set forth in claim 1, wherein said fourth epitaxial layer is GaAs having a dopant of said second conductivity type.

6. A method of manufacturing a semiconductor device as set forth in claim 1, wherein said fourth epitaxial layer is AlGaAs having a dopant of said second conductivity type.

7. A method of manufacturing a semiconductor device as set forth in claim 1, further comprising the step of forming a buffer layer in between said semi-insulating substrate and said first epitaxial layer.

8. A method of manufacturing a semiconductor device as set forth in claim 1, further comprising the step of forming, in said third epitaxial layer, a first Schottky barrier diode connecting to the base of said second vertical transistor, and a second Schottky barrier diode clamping the base and collector of said first vertical transistor.

* * * * *